United States Patent
Liu et al.

(10) Patent No.: US 12,154,844 B2
(45) Date of Patent: Nov. 26, 2024

(54) DUAL-SIDE COOLING SEMICONDUCTOR PACKAGES AND RELATED METHODS

(71) Applicant: SEMICONDUCTOR COMPONENTS INDUSTRIES, LLC, Scottsdale, AZ (US)

(72) Inventors: Yong Liu, Cumberland Foreside, ME (US); Qing Yang, Shenzhen (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 4 days.

(21) Appl. No.: 18/194,780

(22) Filed: Apr. 3, 2023

(65) Prior Publication Data

US 2023/0238307 A1    Jul. 27, 2023

Related U.S. Application Data

(63) Continuation of application No. 17/136,299, filed on Dec. 29, 2020, now Pat. No. 11,646,249.

(51) Int. Cl.
*H01L 23/492*    (2006.01)
*H01L 23/00*    (2006.01)
(Continued)

(52) U.S. Cl.
CPC ...... *H01L 23/4922* (2013.01); *H01L 23/3735* (2013.01); *H01L 24/32* (2013.01);
(Continued)

(58) Field of Classification Search
CPC . H01L 23/4922; H01L 23/3735; H01L 24/32; H01L 24/48; H01L 23/3107; H01L 2224/32258; H01L 2224/48245
(Continued)

(56) References Cited

U.S. PATENT DOCUMENTS

| | | | |
|---|---|---|---|
| 8,450,845 B2 * | 5/2013 | Ikeda | H01L 23/49537 257/E23.101 |
| 11,222,832 B2 * | 1/2022 | Maldo | H01L 24/37 |

(Continued)

FOREIGN PATENT DOCUMENTS

| | | |
|---|---|---|
| DE | 102 31 091 A1 | 1/2004 |
| DE | 10 2006 059 501 A1 | 7/2007 |

(Continued)

*Primary Examiner* — Jasmine J Clark
(74) *Attorney, Agent, or Firm* — Adam R. Stephenson, LTD.

(57) ABSTRACT

A dual-side cooling (DSC) semiconductor package includes a first metal-insulator-metal (MIM) substrate having a first insulator layer, first metallic layer, and second metallic layer. A second MIM substrate includes a second insulator layer, third metallic layer, and fourth metallic layer. The third metallic layer includes a first portion having a first contact area and a second portion, electrically isolated from the first portion, having a second contact area. A semiconductor die is coupled with the second metallic layer and is directly coupled with the third metallic layer through one or more solders, sintered layers, electrically conductive tapes, solderable top metal (STM) layers, and/or under bump metal (UBM) layers. The first contact area is electrically coupled with a first electrical contact of the die and the second contact area is electrically coupled with a second electrical contact of the die. The first and fourth metallic layers are exposed through an encapsulant.

18 Claims, 8 Drawing Sheets

(51) Int. Cl.
*H01L 23/31* (2006.01)
*H01L 23/373* (2006.01)

(52) U.S. Cl.
CPC .......... *H01L 24/48* (2013.01); *H01L 23/3107* (2013.01); *H01L 2224/32258* (2013.01); *H01L 2224/48245* (2013.01)

(58) Field of Classification Search
USPC ........................................................ 257/741
See application file for complete search history.

(56) References Cited

U.S. PATENT DOCUMENTS

| | | | |
|---|---|---|---|
| 2007/0216013 A1* | 9/2007 | Funakoshi | H01L 24/40 |
| | | | 257/691 |
| 2014/0327127 A1 | 11/2014 | Hable et al. | |
| 2016/0126157 A1 | 5/2016 | Jeon | |
| 2019/0326195 A1 | 10/2019 | Han | |
| 2020/0321262 A1 | 10/2020 | Schweikert et al. | |
| 2021/0358876 A1 | 11/2021 | Tzu | |

FOREIGN PATENT DOCUMENTS

| | | |
|---|---|---|
| DE | 10 2007 004 005 A1 | 10/2007 |
| DE | 10 2019 115 857 A1 | 12/2020 |

* cited by examiner

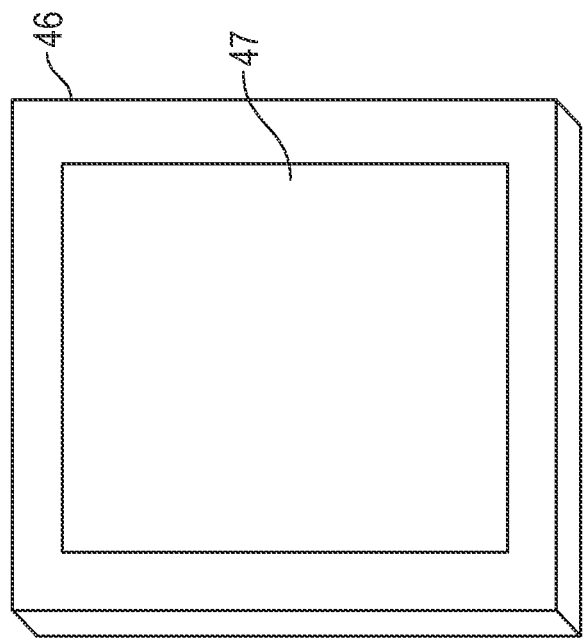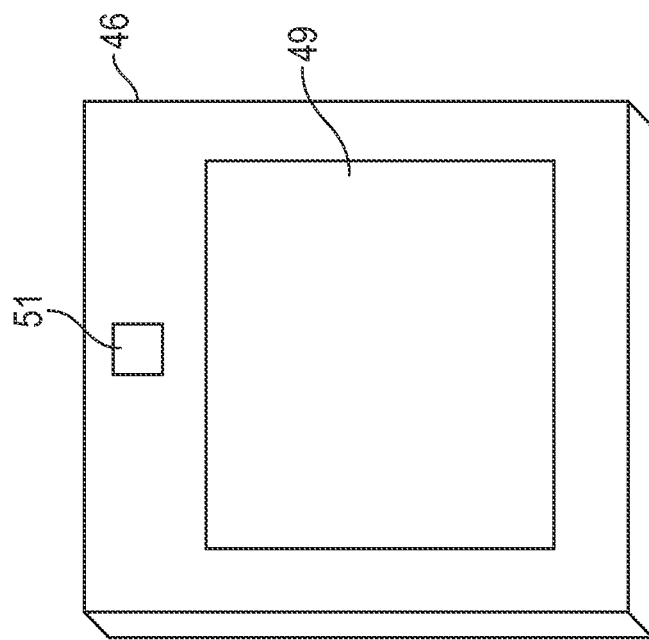
FIG. 10

DUAL-SIDE COOLING SEMICONDUCTOR PACKAGES AND RELATED METHODS

CROSS REFERENCE TO RELATED APPLICATIONS

This application is a continuation application of the earlier U.S. Utility Patent Application to Liu et al., entitled "Dual-Side Cooling Semiconductor Packages and Related Methods," application Ser. No. 17/136,299, filed Dec. 29, 2020, now U.S. Pat. No. 11,646,249, the disclosure of which is hereby incorporated entirely herein by reference.

BACKGROUND

1. Technical Field

Aspects of this document relate generally to semiconductor packages. More specific implementations involve substrates used in the formation of semiconductor packages. More specific implementations involve dual-side cooling (DSC) semiconductor packages.

2. Background

Semiconductor packages may be used to electrically interconnect electrical contacts of a semiconductor die with electrical leads which electrically couple the semiconductor package with a printed circuit board (PCB) or other element. Various semiconductor packages may be attached to heat sinks to draw heat away from the semiconductor die. Heat sinks can include metal-insulator-metal substrates, such as direct bonded copper (DBC) substrates. Wirebonds and other electrical connectors can electrically couple elements within the semiconductor packages. Dual-side cooling (DSC) semiconductor packages include at least two sides/surfaces used for cooling.

SUMMARY

Implementations of dual-side cooling (DSC) semiconductor packages may include: a first metal-insulator-metal (MIM) substrate including a first insulator layer having two largest planar surfaces opposite one another (a first surface and a second surface), a first metallic layer coupled with the first surface, and a second metallic layer coupled with the second surface, wherein the first metallic layer and the second metallic layer are electrically isolated from one another at least partly by the first insulator layer; a second MIM substrate including a second insulator layer having two largest planar surfaces opposite one another (a third surface and a fourth surface), a third metallic layer coupled with the third surface, and a fourth metallic layer coupled with the fourth surface, wherein: the third metallic layer and the fourth metallic layer are electrically isolated from one another at least partly by the second insulator layer; and the third metallic layer has a first portion including one or more first contact areas and a second portion electrically isolated from the first portion and including one or more second contact areas; a semiconductor die coupled with the second metallic layer and the third metallic layer such that the one or more first contact areas are electrically coupled with one or more first electrical contacts of the semiconductor die and the one or more second contact areas are electrically coupled with one or more second electrical contacts of the semiconductor die, wherein the semiconductor die is directly coupled with the third metallic layer through one or more solders, one or more sintered layers, one or more electrically conductive tapes, one or more solderable top metal (STM) layers, and/or one or more under bump metal (UBM) layers; a first lead electrically coupled with the first MIM substrate; a second lead electrically coupled with the second MIM substrate; and an encapsulant at least partially encapsulating the first MIM substrate, the second MIM substrate, the semiconductor die, the first lead, and the second lead to form a semiconductor package, wherein the first metallic layer, the fourth metallic layer, the first lead, and the second lead are each at least partially exposed through the encapsulant.

Implementations of DSC semiconductor packages may include one, all, or any of the following:

The first MIM substrate may be a first direct bonded copper (DBC) substrate. The second MIM substrate may be a second DBC substrate.

All electrical paths from outside the semiconductor package to the semiconductor die may be routed through the second metallic layer and/or the third metallic layer.

The second portion may at least partially circumscribe the first portion.

The one or more first electrical contacts may include one or more source contacts. The one or more second electrical contacts may include one or more gate contacts. The semiconductor die may include one or more drain contacts. The first lead may be a drain lead. The second lead may be a source lead. The semiconductor package may further include a gate lead electrically coupled with the third metallic layer.

The one or more drain contacts may be electrically coupled with the drain lead through the second metallic layer. The one or more source contacts may be electrically coupled with the source lead through the third metallic layer. The one or more gate contacts may be electrically coupled with the gate lead through the third metallic layer.

The one or more first contact areas may have a largest planar surface that is smaller than a largest planar surface of the semiconductor die.

The one or more first contact areas may be formed from the third metallic layer and may be raised above a planar surface of the first portion. The one or more second contact areas may be formed from the third metallic layer and may be raised above a planar surface of the second portion.

The semiconductor die may be directly coupled with the second metallic layer through one or more solders, one or more sintered layers, one or more electrically conductive tapes, one or more solderable top metal (STM) layers, and/or one or more under bump metal (UBM) layers.

Implementations of dual-side cooling (DSC) semiconductor packages may include: a first metal-insulator-metal (MIM) substrate including a first insulator layer having two largest planar surfaces opposite one another (a first surface and a second surface), a first metallic layer coupled with the first surface, and a second metallic layer coupled with the second surface, wherein the first metallic layer and the second metallic layer are electrically isolated from one another at least partly by the first insulator layer; a second MIM substrate including a second insulator layer having two largest planar surfaces opposite one another (a third surface and a fourth surface), a third metallic layer coupled with the third surface, and a fourth metallic layer coupled with the fourth surface, wherein the third metallic layer and the fourth metallic layer are electrically isolated from one another at least partly by the second insulator layer, and wherein one or more contact areas are formed from the third metallic layer; a semiconductor die coupled with the second metallic layer and the third metallic layer such that the one or more contact areas are electrically coupled with one or more first electrical contacts of the semiconductor die, wherein the semiconductor die is directly coupled with the third metallic layer through one or more solders, one or more sintered layers, one or more electrically conductive tapes, one or more solderable top metal (STM) layers, and/or one or more under bump metal (UBM) layers; a first lead electrically coupled with the first MIM substrate; a second lead electrically coupled with the second MIM substrate; a third lead electrically coupled with one or more second electrical contacts of the semiconductor die through one or more wirebonds; and an encapsulant at least partially encapsulating the first MIM substrate, the second MIM substrate, the semiconductor die, the first lead, the second lead, and the third lead to form a semiconductor package, wherein the first metallic layer, the fourth metallic layer, the first lead, the second lead, and the third lead are each at least partially exposed through the encapsulant.

Implementations of DSC semiconductor packages may include one, all, or any of the following:

The one or more first electrical contacts may include one or more source contacts. The one or more second electrical contacts may include one or more gate contacts. The semiconductor die may include one or more third electrical contacts including one or more drain contacts. The first lead may be a drain lead and may be electrically coupled with the one or more drain contacts. The second lead may be a source lead and may be electrically coupled with the one or more source contacts. The third lead may be a gate lead and may be electrically coupled with the one or more gate contacts.

The one or more contact areas may have a largest planar surface that is smaller than a largest planar surface of the semiconductor die.

The one or more contact areas may be formed from the third metallic layer and may be raised above a planar surface of the third metallic layer.

The semiconductor die may be directly coupled with the second metallic layer through one or more solders, one or more sintered layers, one or more electrically conductive tapes, one or more solderable top metal (STM) layers, and/or one or more under bump metal (UBM) layers.

Implementations of DSC semiconductor packages may include: a first metal-insulator-metal (MIM) substrate including a first insulator layer having two largest planar surfaces opposite one another (a first surface and a second surface), a first metallic layer coupled with the first surface, and a second metallic layer coupled with the second surface, wherein the first metallic layer and the second metallic layer are electrically isolated from one another at least partly by the first insulator layer; a second MIM substrate including a second insulator layer having two largest planar surfaces opposite one another (a third surface and a fourth surface), a third metallic layer coupled with the third surface, and a fourth metallic layer coupled with the fourth surface, wherein: the third metallic layer and the fourth metallic layer are electrically isolated from one another at least partly by the second insulator layer; and the third metallic layer includes: a first portion including one or more first contact areas formed from the third metallic layer and raised above a planar surface of the first portion; and a second portion electrically isolated from the first portion and including one or more second contact areas formed from the third metallic layer and raised above a planar surface of the second portion; a semiconductor die coupled with the second metallic layer and the third metallic layer such that the one or more first contact areas are electrically coupled with one or more first electrical contacts of the semiconductor die and the one or more second contact areas are electrically coupled with one or more second electrical contacts of the semiconductor die; a first lead electrically coupled with the first MIM substrate; a second lead electrically coupled with the second MIM substrate; a third lead electrically coupled with the second MIM substrate; and an encapsulant at least partially encapsulating the first MIM substrate, the second MIM substrate, the semiconductor die, the first lead, the second lead, and the third lead, wherein the first metallic layer, the fourth metallic layer, the first lead, the second lead, and the third lead are each at least partially exposed through the encapsulant.

Implementations of DSC semiconductor packages may include one, all, or any of the following:

The semiconductor die may be directly coupled with the second metallic layer through one or more solders, one or more sintered layers, one or more electrically conductive tapes, one or more solderable top metal (STM) layers, and/or one or more under bump metal (UBM) layers. The semiconductor die may be directly coupled with the third metallic layer through one or more solders, one or more sintered layers, one or more electrically conductive tapes, one or more solderable top metal (STM) layers, and/or one or more under bump metal (UBM) layers.

All electrical paths from outside the semiconductor package to the semiconductor die may be routed through the first MIM substrate and/or the second MIM substrate.

The second portion may at least partially circumscribe the first portion.

A drain contact of the semiconductor die may be electrically coupled with the first lead through the second metallic layer. The one or more first electrical contacts may include one or more source contacts and may be electrically coupled with the second lead through the third metallic layer. The one or more second electrical contacts may include one or more gate contacts and may be electrically coupled with the third lead through the third metallic layer.

The one or more first contact areas may have a largest planar surface that is smaller than a largest planar surface of the semiconductor die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 10 includes a top view and a bottom view of a semiconductor die.

DESCRIPTION

Figure 1:
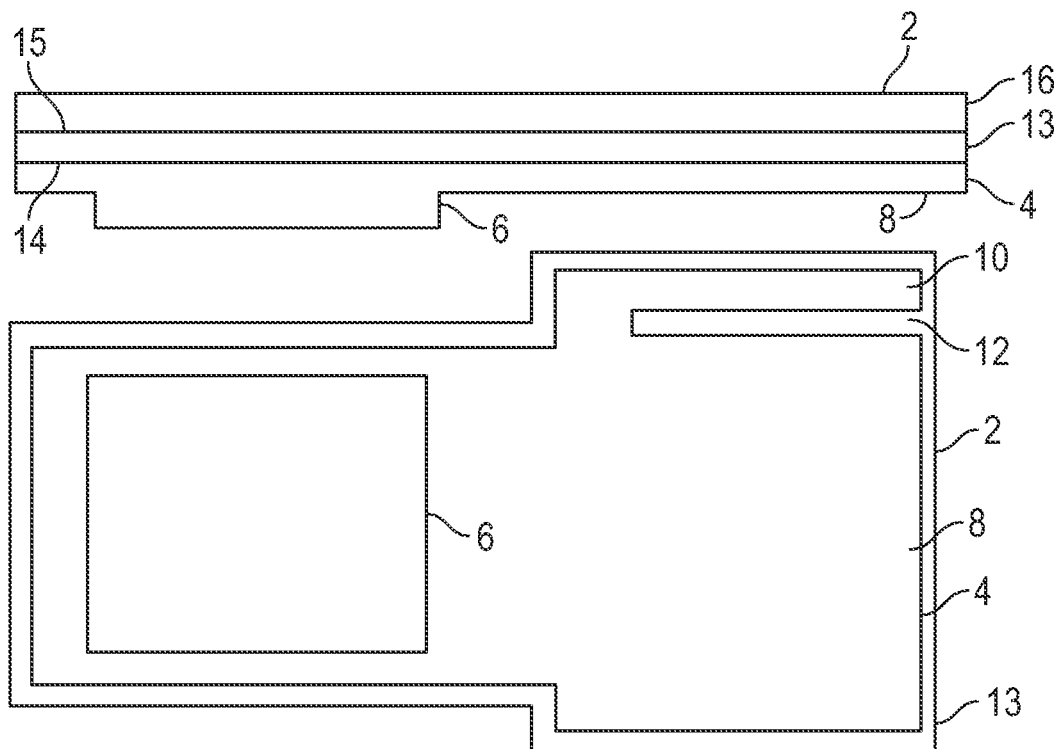
FIG. 1 includes a side view of an implementation of a metal-insulator-metal (MIM) substrate and a top see-through view of the MIM substrate with one layer not shown.

This disclosure, its aspects and implementations, are not limited to the specific components, assembly procedures or method elements disclosed herein. Many additional components, assembly procedures and/or method elements known in the art consistent with the intended dual-side cooling semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such dual-side cooling semiconductor packages and related methods, and implementing components and methods, consistent with the intended operation and methods.

As used herein, the terms "metal-insulator-metal substrate" and "MIM substrate" refers to a substrate that includes an insulator layer having two largest surfaces opposite each other (a first surface and a second surface), a first metal layer coupled with the first surface, and a second metallic layer coupled with the second surface, wherein the insulator layer electrically insulates the first metallic layer and the second metallic layer from one another. As used herein, the term "spacer" excludes soldered layers, sintered layers, solder bumps, electrically conductive tape layers, solderable top metal (STM) layers, under bump metal (UBM) layers, encapsulants, substrates or any portion thereof, and semiconductor die or any portion thereof. As used herein, the term "electrical path" means a path that is configured to carry or provide an electrical signal, a current, or a voltage.

This disclosure discusses dual-side cooling (DSC) semiconductor packages which each include two metal-insulator-metal (MIM) substrates. Each MIM substrate includes an insulator layer sandwiched between two metallic layers. In order to refer to the layers in an understandable way they are labeled "first," "second," and so forth, starting from the bottommost layer and moving up in the various figures. This designation is, accordingly, arbitrary (indeed the rotation of any given semiconductor package in the drawings is arbitrary, so that what is the "bottom" or "top" of any given package is arbitrary), but it is useful for keeping track of the different layers. For example, referring to FIG. 6, the bottom image shows a semiconductor package 102 having a bottom MIM substrate 104 and a top MIM substrate 112. Each of the MIM substrates includes an insulator layer. The bottom insulator layer is designated a first insulator layer 108 and the top insulator layer is designated a second insulator layer 124. Each of the MIM substrates includes two metallic layers. The bottommost is designated a first metallic layer 110, the next up is designated a second metallic layer 106, the next up is designated a third metallic layer 114, and the topmost is designated a fourth metallic layer 126.

This representation is used throughout, so that in discussing the semiconductor packages there is always one MIM substrate that includes a first insulator layer, a first metallic layer, and a second metallic layer, and there is always one MIM substrate that includes a second insulator layer, a third metallic layer, and a fourth metallic layer. The fact that the topmost MIM substrate is stated to have a "second insulator layer" naturally does not imply that it has another "first" insulator layer—it only has one insulator layer in implementations, but it is called a second insulator layer to distinguish it from the insulator of the bottommost MIM substrate. Similarly, the fact that the topmost MIM substrate is stated to have a "third metallic layer" and a "fourth metallic layer" does not imply that it has four metallic layers—it only has two metallic layers in implementations, but they are called the third and fourth metallic layers to distinguish them from the metallic layers of the bottommost substrate. Similarly, the insulator layer of the topmost MIM substrate has two surfaces that are called a third surface and a fourth surface, respectively, only to distinguish them from surfaces of the insulator layer of the bottommost MIM substrate, which are called a first surface and a second surface, respectively.

Referring now to FIG. 1, an implementation of a metal-insulator-metal (MIM) substrate 2 is illustrated. The top of FIG. 1 shows a side image of the MIM substrate and the bottom of FIG. 1 shows a top see-through view of the MIM substrate. This MIM substrate includes an insulator layer and two metallic layers. Because this MIM substrate would be positioned in a topmost location in a semiconductor package, according to the rotation/positions of the semiconductor packages shown in other figures, these layers are called a second insulator layer 13, a third metallic layer 4, and a fourth metallic layer 16. The insulator layer has two largest planar surfaces—a third surface 14 and a fourth surface 15. The third metallic layer is coupled with the third surface and the fourth metallic layer is coupled with the fourth surface. The top portion of FIG. 1 shows both metallic layers. The bottom portion of FIG. 1 excludes the fourth metallic layer, for ease of viewing the other elements, and the second insulator layer and third metallic layer are shown in see-through, with the second insulator layer facing out of the page and the third metallic layer facing into the page.

The third metallic layer includes a contact area (pad) 6. The contact area is raised relative to a planar surface of the third metallic layer (in the bottom portion of FIG. 1 the contact area is raised into the page, as the planar surface faces into the page). The contact area may also be called a pad, a stud, or in this implementation a source pad (inasmuch as it is configured to contact a source contact of a semiconductor die). The third metallic layer includes other contact areas for electrically coupling with electrical leads of a semiconductor package, including a source lead contact 8 configured to electrically couple with a source lead, and a sensor lead contact 10 configured to electrically couple with a sensor lead. A separation 12 is included which separates the source lead contact from the sensor lead contact. As with all other electrical couplings disclosed herein, the source lead contact and sensor lead contact may be electrically coupled with other package elements using a solder, a conductive tape, or any other electrically conductive coupler.

Figure 3:
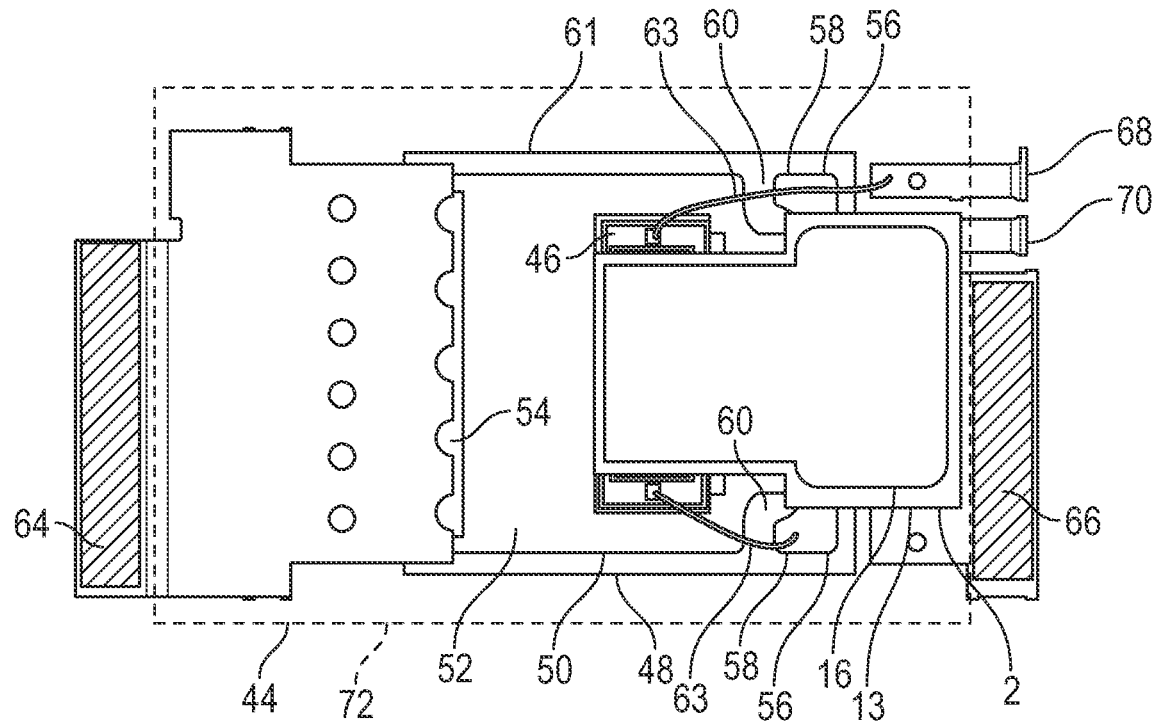
FIG. 3 is a top partial-see-through view of an implementation of a dual-side cooling (DSC) semiconductor package.

FIG. 3 illustrates a dual-side cooling (DSC) semiconductor package (package) 44 which includes MIM substrate 2. Package 44 also includes two semiconductor die (die) 46, which are representatively illustrated in FIG. 10. The left portion of FIG. 10 shows a top of the die 46 (which includes a source contact 49 and gate contact 51) and the right portion of FIG. 10 shows a bottom of the die (which includes a drain contact 47). Referring back to FIG. 3, the MIM substrate 2 is depicted in the same position/orientation as the position/orientation of the bottom portion of FIG. 1, except all layers are included and the MIM substrate is not shown in see-through. Accordingly, the fourth metallic layer 16 and second insulator layer are visible, but the third metallic layer is not visible. The source lead contact of the third metallic layer is electrically coupled with a source lead (lead) 66, and the sensor lead contact of the third metallic layer is electrically coupled with a sensor lead 70. The contact area 6 is electrically coupled with two source contacts 49 of two semiconductor die 46. In FIG. 3 the source contacts are not easily visible, but the gate contact 51 of each is visible (each gate contact having a wirebond 63 electrically coupled thereto).

Figure 5:
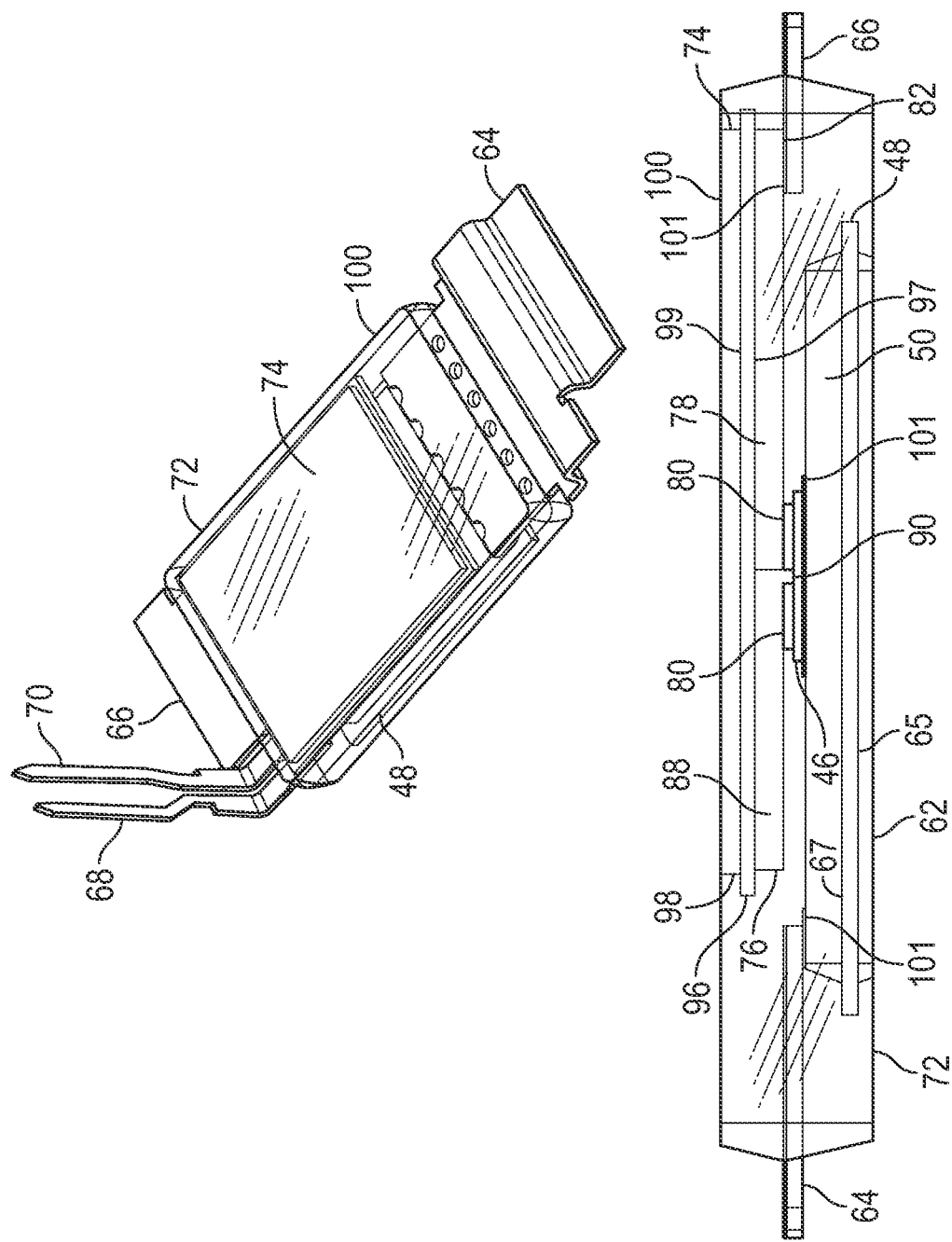
FIG. 5 includes a perspective partial-see-through view of an implementation of a DSC semiconductor package and a side partial-see-through view of the DSC semiconductor package with some elements not shown.

The semiconductor die is coupled atop MIM substrate 48. MIM substrate 48 includes a first insulator layer 61, a first metallic layer 62, and a second metallic layer 50. The first metallic layer 62 is not visible in FIG. 3, but MIM substrate is also shown in FIG. 5 in another DSC semiconductor package, and the first metallic layer 62 is there visible. FIG. 5 also shows two largest planar surfaces of the first insulator layer 61, first surface 65 and second surface 67. The first metallic layer is coupled to first surface 65 and the second metallic layer is coupled to second surface 67. The second metallic layer is seen in FIG. 3 to include a first portion 52 which includes a drain lead contact 54 and a second portion 56 which includes gate contacts 58. A separation 60 separates these portions so that they are electrically isolated from one another. A first wirebond 63 electrically couples the gate contact 51 of one of the die with a gate contact 58 of the second portion 56. A second wirebond 63 electrically couples the gate contact 51 of the other die with another gate contact 58 of the second portion and, also, electrically couples the second portion with a gate lead 68. A drain lead 64 is electrically coupled to the first portion 52 at the drain lead contact 54. The drain contact 47 of the die is electrically coupled with the first portion and, thereby, to the drain lead. The leads 64, 66, 68, and 70 are exposed through the encapsulant. The first metallic layer and fourth metallic layer are also exposed through the encapsulant, allowing double-side cooling.

Figure 2:
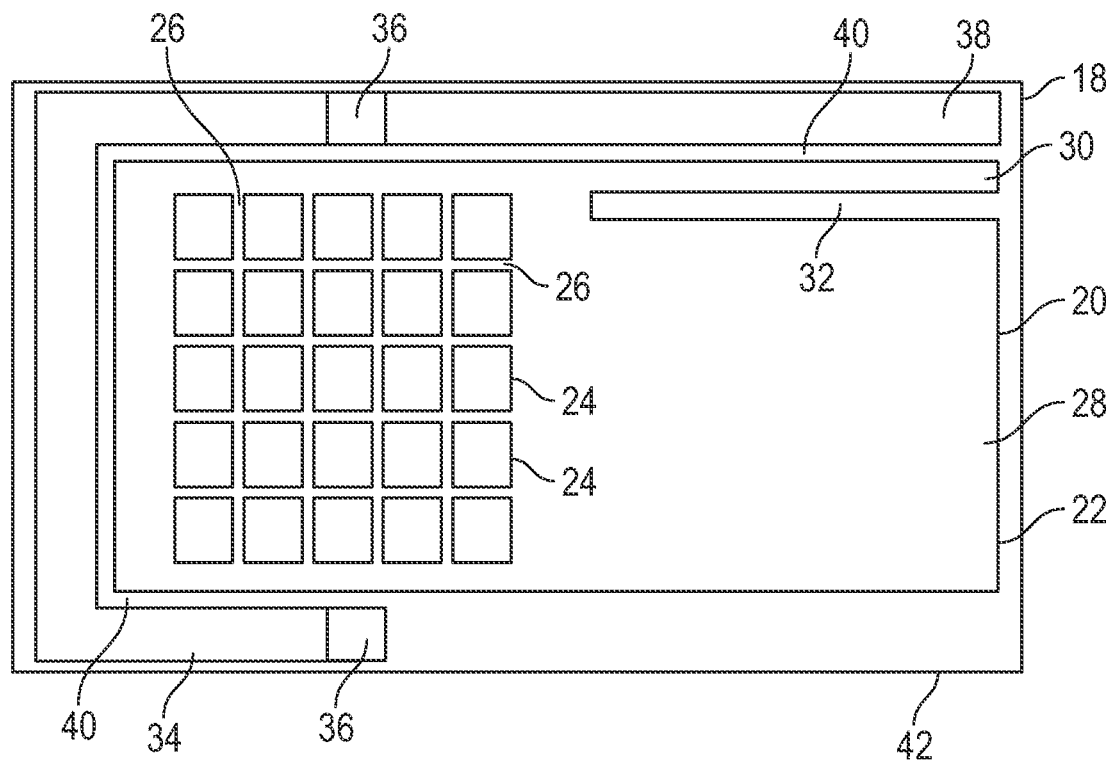
FIG. 2 is a top see-through view of an implementation of an MIM substrate with one layer not shown.

FIGS. 1 and 3 accordingly illustrate elements of a semiconductor package that uses wirebonds for some of the electrical couplings. FIG. 2 shows a version of a MIM substrate 18 which obviates the need for wirebonds. MIM substrate 18 includes a second insulator layer 42. The insulator layer has two largest planar surfaces—a third surface and a fourth surface. The third metallic layer 20 is coupled with the third surface and the fourth metallic layer is coupled with the fourth surface. FIG. 2 does not show the fourth metallic layer, for ease of viewing the other elements, and the second insulator layer and third metallic layer are shown in see-through, with the second insulator layer facing out of the page and the third metallic layer facing into the page.

The third metallic layer 20 includes a first portion 22 and a second portion 34 which are electrically isolated from one another using a separation 40. As with other separations discussed herein, this separation could be formed through a material removal technique such as, by non-limiting example, etching, milling, laser ablation, and so forth. The first portion includes a plurality of first contact areas 24. These may also be called pads, source pads, and/or studs. In FIG. 2 they are seen to be organized into a grid/pattern of rows and columns. The first contact areas are seen to each have a square shape, but in implementations they could also have a round shape, a hexagonal shape, and any other polygonal, regular, or irregular shape. Additionally, the overall perimeter of the plurality of first contact areas could have any shape. For example, in FIG. 2 a perimeter which would tightly enclose all of the first contact areas would have a square shape, so that the first contact areas are organized into an overall square shape/pattern, but in implementations the first contact areas could, regardless of the shape of individual first contact areas, be organized into a circular shape/pattern, or a hexagonal shape/pattern, or any other polygonal, regular, or irregular shape/pattern. In short, the first contact areas 24 may have any shape, configuration, size, and number, and multiple first contact areas may in implementations be organized into any overall shape or pattern. For example, in implementations where MIM substrate 18 would be coupled with four semiconductor die, there may be four first contact areas 24. There may be more than one first contact area for each semiconductor die, however.

Each first contact area is raised from a planar surface of the third metallic layer (in FIG. 2 each would be raised towards a direction into the page). The use of raised first contact areas can, in implementations, improve an electromechanical coupling between each first contact area 24 and a semiconductor die. When a solder is used to couple the first contact areas 24 with one or more source contacts of a semiconductor die, for example the solder may contact both the face of each first contact area/pad as well as the sidewalls thereof (and filling in the grooves in implementations which include multiple first contact areas separated by grooves), allowing for greater surface/contact area between the contact area and solder (or other electromechanical coupler), greater adhesion, improved electric properties, and improved mechanical properties (e.g., reducing the likelihood of separation/failure). Accordingly, the user may increase the surface area of the first contact areas 24 by including more of them (for example two for each die, or three for each die, and so on). The pattern of columns and rows, or any other pattern, may be formed through any material removal technique. The pattern shown in FIG. 2 includes grooves 26 between the first contact areas 24, each groove being formed using a material removal technique. The first contact areas (and second contact areas) may be formed by a half-depth etch of the third metallic layer, as a non-limiting example, which etching may raise the first and second contact areas above planar surfaces of the first and second portions, respectively, and may also form the grooves 26 in implementations where those are included.

The first portion 22 also includes a source lead contact 28 and a sensor lead contact 30, separated by a separation 32, similar to similar-named elements of MIM 2. The second portion 34 includes two raised second contact areas 36. These may also be called pads, gate pads, or studs. In FIG. 2 these are raised towards a direction into the page. The second contact areas are configured to contact the gate contacts of the semiconductor die, and the second portion also includes a gate lead contact 38 that is configured to couple with the gate lead of a DSC semiconductor package. Referring again to FIG. 3, MIM substrate 18 could be used instead of MIM substrate 2, and the second portion would electrically couple both gate contacts with the gate lead (the second contact areas each being electrically coupled with one of the gate contacts and the gate lead contact being electrically coupled with the gate lead 68. The wirebonds would not be needed, so would be excluded, and the MIM 48 in such an implementation could exclude second portion 56. In such an implementation, all electrical paths from outside the DSC package to the one or more semiconductor die would pass through the MIM substrates, specifically through the third and fourth metallic layers.

Figure 4:
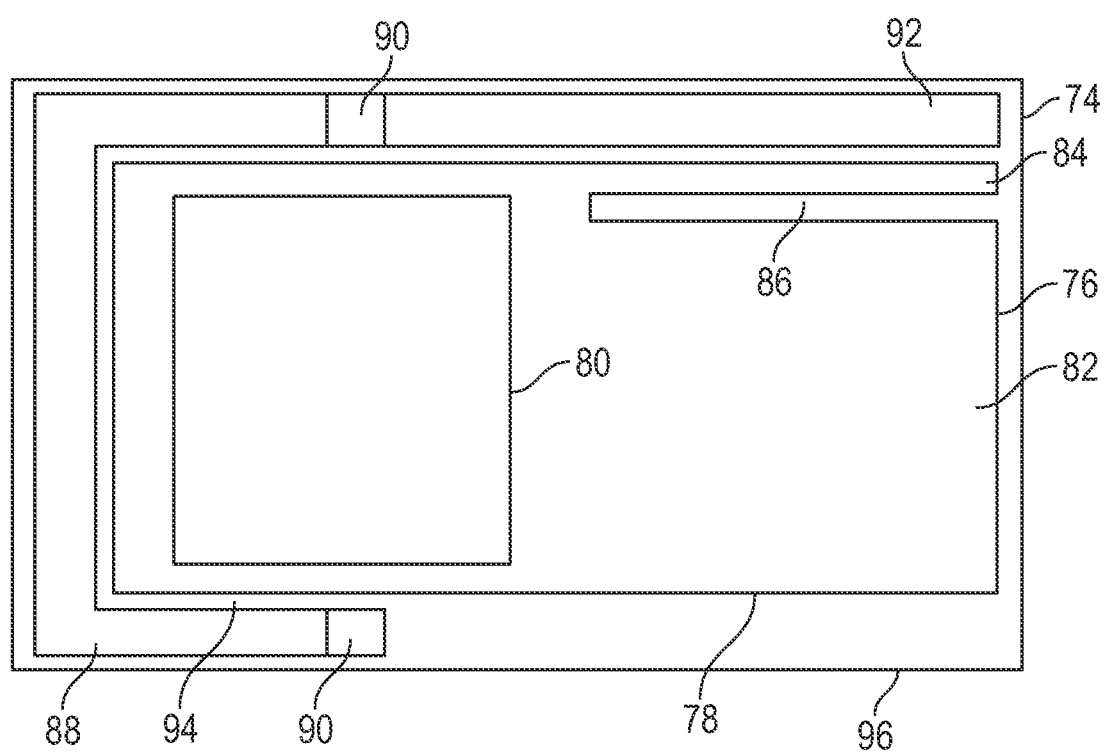
FIG. 4 is a top see-through view of an implementation of an MIM substrate with one layer not shown.

FIGS. 4-5 illustrates an MIM substrate 74 which also obviates the need for wirebonds. MIM substrate 74 includes a second insulator layer 96. The insulator layer has two largest planar surfaces—a third surface 97 and a fourth surface 99. The third metallic layer 76 is coupled with the third surface and the fourth metallic layer is coupled with the fourth service. In FIG. 4 the fourth metallic layer 98 is not shown, for ease of viewing the other elements, and the second insulator layer and third metallic layer are shown in see-through, with the second insulator layer facing out of the page and the third metallic layer facing into the page. Fourth metallic layer 98 is seen in FIG. 5, however. Third metallic layer 76 includes a first portion 78 which includes a single first contact area 80, which may also be called a pad, source pad, or stud. The first portion also includes a source lead contact 82 and a sensor lead contact 84 with a separation 86 therebetween. Third metallic layer 76 includes a second portion 88 which is electrically isolated from the first portion using a separation 94. The second portion includes two raised second contact areas 90. These may also be called pads, gate pads, or studs. These are configured to contact gate contacts of semiconductor die. The second contact areas 90 are raised towards a direction into the page in FIG. 4. Second portion 88 also includes a gate lead contact 92. MIM substrate 74 is identical to MIM substrate 18 except that a single first contact area 80 is used, instead of a grid or array of multiple first contact areas. The first contact area(s) and/or the second contact area(s) of any of the MIM substrates disclosed herein may have a square shape, rectangular shape, round shape, hexagonal shape, polygonal shape, non-polygonal shape, any regular shape, or any irregular shape—in short any shape and/or configuration that would have desirable thermal, electrical, and/or mechanical properties. The second portion is seen to at least partially circumscribe the first portion.

FIG. 5 illustrates a DSC semiconductor package (package) 100 which includes a semiconductor die 46, a MIM substrate 48, and a MIM substrate 76. The first metallic layer 62 and the fourth metallic layer 98 are each at least partially exposed through the encapsulant 72, providing double-side cooling. The leads 68 and 70 are not shown in the lower portion of FIG. 5. Each of the leads may be electromechanically coupled with a portion of a MIM substrate using an electromechanical coupler 101. This could include, by non-limiting example, a solder, a conductive tape, a sintered layer, and any other material/mechanism for electromechanical coupling. Drain lead 64 is accordingly shown electromechanically coupled with second metallic layer 50 using an electromechanical coupler 101, and source lead 66 is shown electromechanically coupled with third metallic layer 88 through an electromechanical coupler 101. Leads 68 and 70 could similarly be electromechanically coupled with the third metallic layer using an electromechanical coupler 101. The die is seen coupled with the second metallic layer using an electromechanical coupler 101. The use of the element number 101 for all of these electromechanical couplers does not imply that they all would use the same material.

Both the perspective and side views of FIG. 5 show the encapsulant in see-through format so that other elements can more easily be seen. One of the second contact areas 90 can be seen extending from a planar surface of the second portion 88 to contact a gate contact of one of the die 46. The first contact area 80 can also be seen extending from a planar surface of the first portion 78 to contact a source contact of one of the die 46. As with other packages disclosed herein, package 100 includes two semiconductor die. Other DSC semiconductor packages could include other numbers of semiconductor die, and additional or fewer first contact areas and second contact areas could be included to electrically couple with the electrical contacts of the die.

Although the first contact areas and second contact areas shown in the drawings are raised from planar surfaces of the first portions and second portions, respectively, in other implementations they could be flush with the respective planar surfaces.

Figure 6:
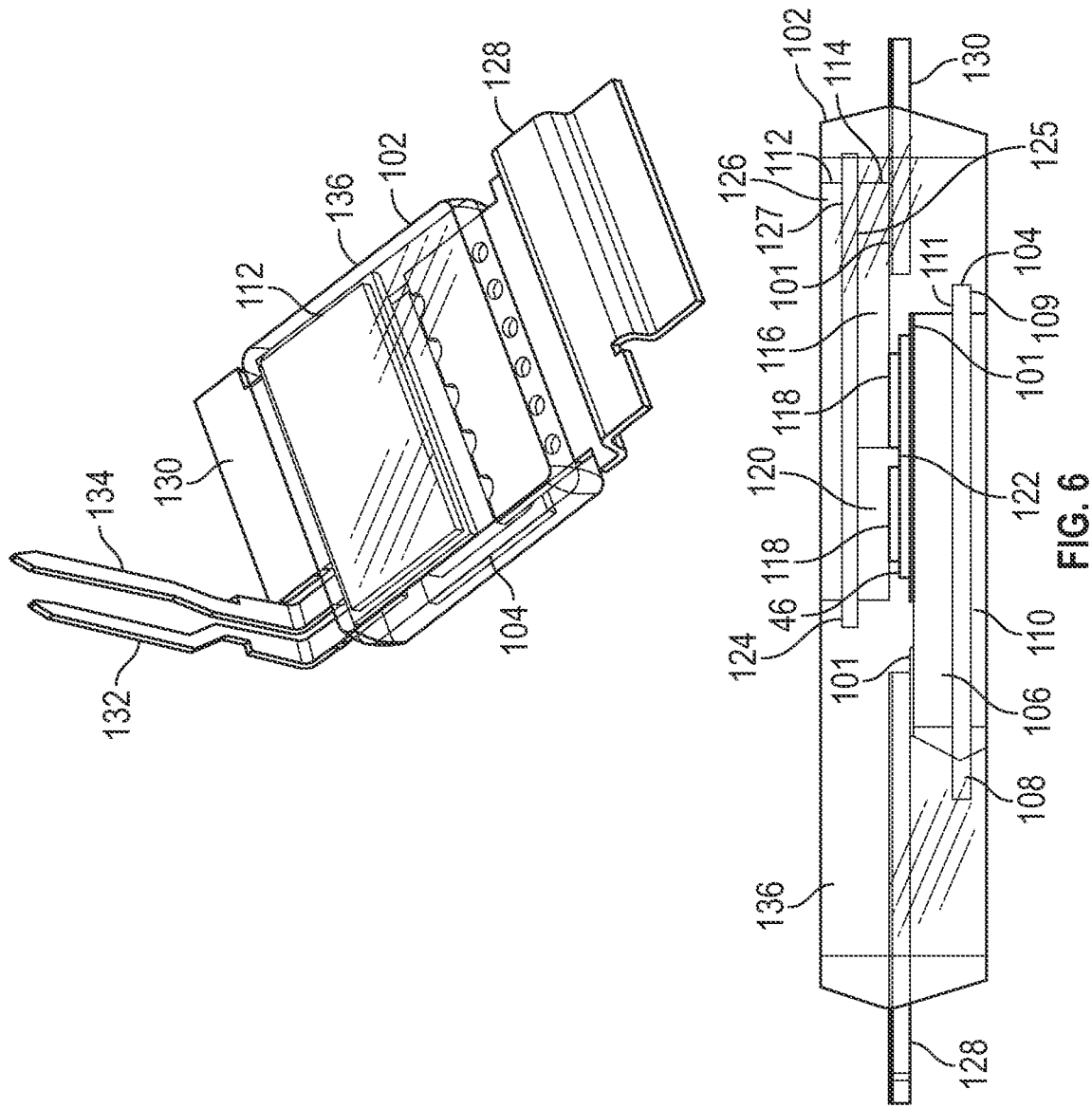
FIG. 6 includes a perspective partial-see-through view and an implementation of a DSC semiconductor package and a side partial-see-through view of the DSC semiconductor package with some elements not shown.

FIG. 6 illustrates a DSC semiconductor package (package) 102 that is similar to package 100 except more compact. In some implementations a smaller package is desirable and/or is feasible. The top of FIG. 6 shows a perspective view of the package and the bottom of FIG. 6 shows a side view of the package—in both cases the encapsulant is shown in see-through format so as to easily see other elements. The side view does not show the gate lead 132 and sensor lead 134. Package 102 includes an MIM substrate 104 (which could be called a drain MIM substrate) which includes a first insulator layer 108 having two largest surfaces opposite one another—a first surface 109 and a second surface 111. MIM substrate 104 includes a first metallic layer 110 coupled with the first surface and a second metallic layer 106 coupled with the second surface. A semiconductor die 46 is coupled with the second metallic layer 106 using an electromechanical coupler 101. The second metallic layer is also electromechanically coupled with a drain lead 128 using an electromechanical coupler 101.

Package 102 includes a MIM substrate 112 which includes a second insulator layer 124 having two largest planar surfaces, a third surface 125 and a fourth surface 127. MIM substrate 112 includes a third metallic layer 114 coupled with the third surface and a fourth metallic layer 126 coupled with the fourth surface. The third metallic layer includes a first portion 116 having a raised first contact area 118 (which may also be called a pad, source pad, or stud) and a second portion 120 having two raised second contact areas 122 (which may also be called pads, gate pads, or studs). Package 102 includes two semiconductor die, so that first contact area 118 electrically couples with source contacts of the two die to electrically couple the source contacts with the source lead 130, and the two second contact areas 122 electrically couple with gate contacts of the two die to electrically couple the gate contacts with the gate lead 132. The second metallic layer 106 electrically couples with the drain contacts of the two die to electrically couple the drain contacts with the drain lead 128.

MIM substrate 112 is similar to MIM substrate 74, only reduced in size along at least one dimension, to accommodate the smaller package size. The third metallic layer of MIM substrate 74 includes a gate lead contact, a source lead contact, a sensor lead contact, and separations therebetween. The source lead 130, gate lead 132, and sensor lead 134 are electromechanically coupled with the source lead contact, gate lead contact, and sensor lead contact, respectively, using an electromechanical coupler 101. Each electromechanical coupler 101, as indicated above, may include different materials. The first metallic layer 110 and fourth metallic layer 126 are each at least partially exposed through an encapsulant 136 to provide dual-side cooling. The leads 128, 130, 132, and 134 are also each at least partially exposed through encapsulant 136 to electrically couple the gate, source, and drain contacts of the semiconductor die with gate, source, and drain electrical nodes, respectively.

In the bottom portion of FIG. 6 one of the second contact areas 122 can be seen extending from a planar surface of the second portion 120 to contact a gate contact of one of the die 46. The first contact area 118 can also be extending from a planar surface of the first portion 116 to contact a source contact of one of the die 46.

Figure 7:
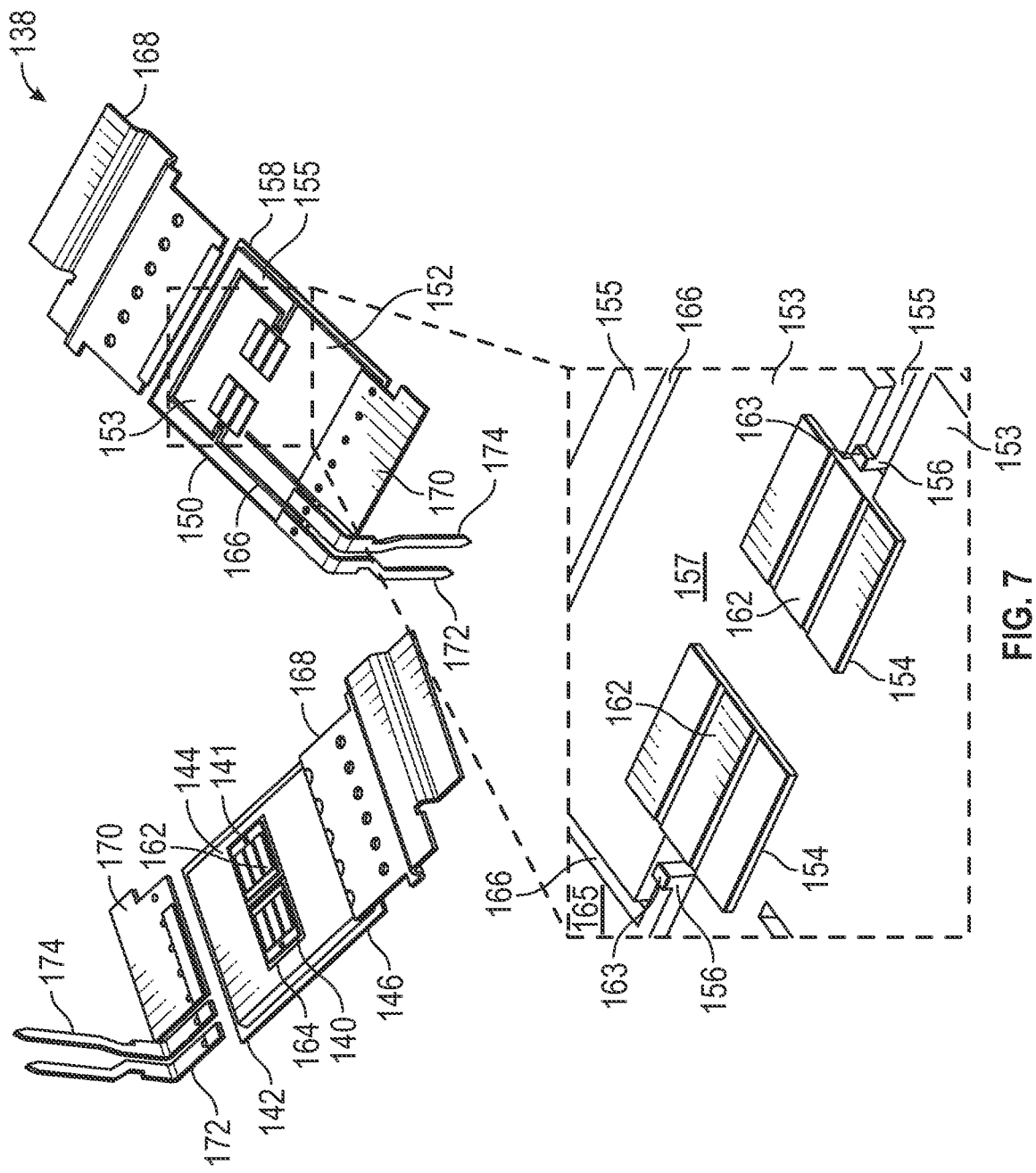
FIG. 7 includes two perspective views and a close-up view of elements of an implementation of a DSC semiconductor package.
Figure 9:
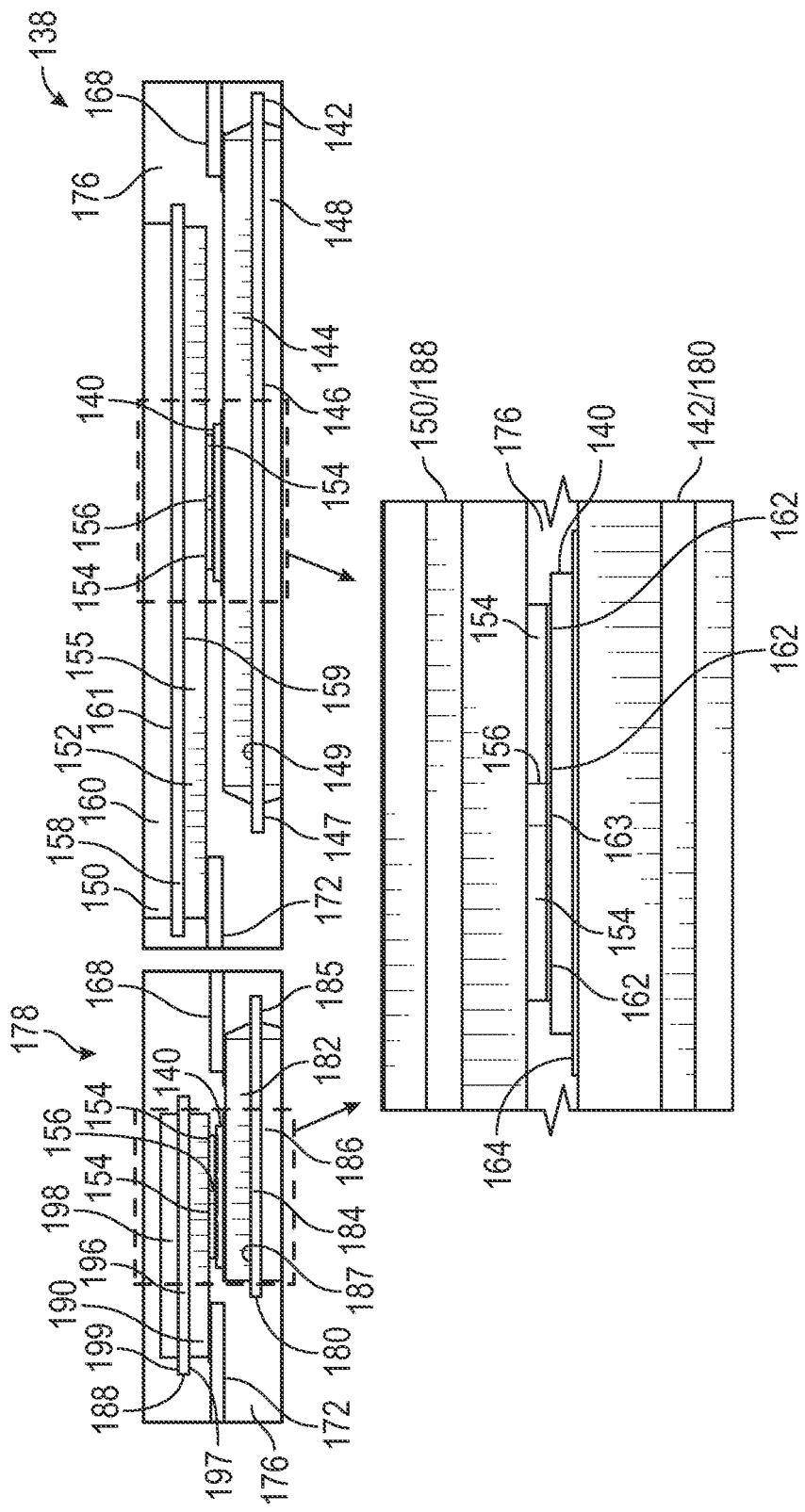
FIG. 9 includes three side partial-see-through views of the DSC semiconductor packages of FIGS. 7 and 8.

FIGS. 7 and 9 show elements of another implementation of a DSC semiconductor package 138. The entire package is not shown in FIG. 7—the encapsulant is excluded so that the other elements can be seen, but the encapsulant is shown in the FIG. 9 top right image in see-through format. The upper left of FIG. 7 shows two semiconductor die 140 each having a gate contact 141. Each semiconductor die also has a source contact proximate the gate contact, but the source contacts are not visible in FIG. 7 because, in the upper left image, they are covered with electromechanical couplers 162. Each semiconductor also has a drain contact electromechanically coupled with the second metallic layer 144 of the MIM substrate 142 using an electromechanical coupler 164. In this implementation MIM substrate 142 may be called a drain MIM substrate because it electrically couples (using the second metallic layer) the drain contacts of the semiconductor die with the drain lead 168.

MIM substrate 142 includes a first insulator layer 146 having two largest planar surfaces: a first surface 147 and a second surface 149. The first metallic layer 148 is coupled with the first surface and the second metallic layer 144 is coupled with the second surface. As with other MIM substrates disclosed herein, the insulator layer electrically insulates the two metallic layers coupled with it.

The top left image of FIG. 7 accordingly shows MIM substrate 142 together with the drain lead 168, source lead 170, gate lead 172, sensor lead 174, and electromechanical couplers 162. The top right image of FIG. 7 shows MIM substrate 150 together with the drain lead 168, source lead 170, sensor lead 174, and electromechanically couplers 162. The leads 168, 170, 172, 174, and electromechanical couplers 162 of the top right image are the same as those shown in the top left image—they are repeated in each image only so that their positions relative to each MIM substrate can more easily be seen.

MIM substrate 150 includes a second insulator layer 158 having two largest planar surface opposite one another: third surface 159 and fourth surface 161. Third metallic layer 152 is coupled with the third surface and fourth metallic layer 160 is coupled with the fourth surface. The third metallic layer includes a first portion 153 having multiple first contact areas 154. The first contact areas may also be called pads, source pads and/or studs. The first contact areas 154 are raised above a planar surface 157 of the first portion. The third metallic layer also includes a second portion 155 having multiple second contact areas 156. The second contact areas may also be called pads, gate pads, and/or studs. The second contact areas 156 are raised above a planar surface 165 of the second portion. The first portion and second portion are electrically isolated from one another at least partly through a separation 166, which may be formed in the third layer using any material removal technique. During assembly of the DSC package the first contact areas are electromechanically coupled with the source contacts of the die using electromechanical coupler 162, the second contact areas are electromechanically coupled with the gate contacts 141 using electromechanical coupler 163, and an encapsulant 176 is used to at least partially encapsulate the MIM substrates 142 and 150 and the leads 168, 170, 172, 174 (and to fully encapsulate other elements, such as the die).

When the package is fully assembled the second and fourth metallic layers are at least partially exposed through the encapsulant for dual-side cooling, and each of the leads is also at least partially exposed through the encapsulant to electrically couple the gate, source, and drain contacts of the die with electrical nodes outside the package (including a sensor node coupled with the sensor lead 174). The various elements of the package form different electrical nodes within the package, including: a source node including the source lead, first portion, and source contacts of the semiconductor die; a gate node including the gate lead, second portion, and gate contacts of the semiconductor die; and a drain node including the drain lead, the second metallic layer, and the drain contacts of the semiconductor die. Each node also includes electromechanical couplers. A sensor node may be the same node as the source node and may include the first portion and the sensor lead.

The side partial-see-through view of the top right of FIG. 9 shows a first contact area 154 of the first portion 153 electromechanically coupled with a source contact of one of the semiconductor die 140 and also shows a second contact area 156 of the second portion 155 electromechanically coupled with a gate contact 141 of one of the semiconductor die. Each of the leads may be coupled with its respective metallic layer using an electromechanical coupler.

Figure 8:
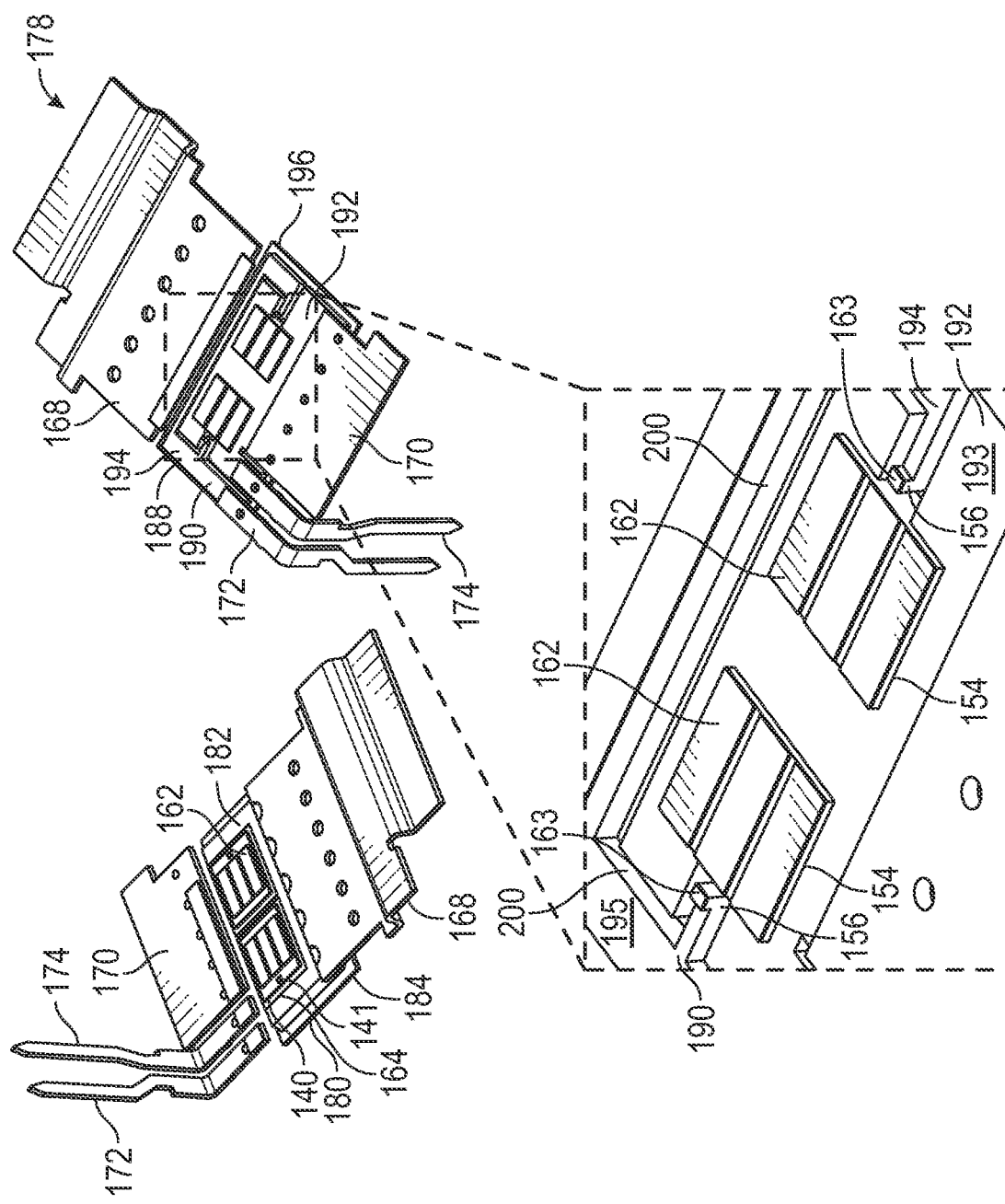
FIG. 8 includes two perspective views and a close-up view of elements of an implementation of a DSC semiconductor package.

FIGS. 8 and 9 show elements of another implementation of a DSC semiconductor package 178. The entire package is not shown in FIG. 8—the encapsulant is excluded so that the other elements can be seen, but the encapsulant is shown in the FIG. 9 top left image in see-through format. The upper left of FIG. 8 shows two semiconductor die 140 each having a gate contact 141. Each semiconductor die also has a source contact proximate the gate contact, but the source contacts are not visible in FIG. 8 because, in the upper left image, they are covered with electromechanical couplers 162. Each semiconductor also has a drain contact electromechanically coupled with the second metallic layer 182 of the MIM substrate 180 using an electromechanical coupler 164. In this implementation MIM substrate 180 may be called a drain MIM substrate because it electrically couples (using the second metallic layer) the drain contacts of the semiconductor die with the drain lead 168.

MIM substrate 180 includes a first insulator layer 184 having two largest planar surfaces: a first surface 185 and a second surface 187. The first metallic layer 186 is coupled with the first surface and the second metallic layer 182 is coupled with the second surface. As with other MIM substrates disclosed herein, the insulator layer electrically insulates the two metallic layers coupled with it.

The top left image of FIG. 8 accordingly shows MIM substrate 180 together with the drain lead 168, source lead 170, gate lead 172, sensor lead 174, and electromechanical couplers 162. The top right image of FIG. 8 shows MIM substrate 188 together with the drain lead 168, source lead 170, sensor lead 174, and electromechanically couplers 162. The leads 168, 170, 172, 174, and electromechanical couplers 162 of the top right image are the same as those shown in the top left image—they are repeated in each image only so that their positions relative to each MIM substrate can more easily be seen.

MIM substrate 188 includes a second insulator layer 196 having two largest planar surface opposite one another: third surface 197 and fourth surface 199. Third metallic layer 190 is coupled with the third surface and fourth metallic layer 198 is coupled with the fourth surface. The third metallic layer includes a first portion 192 having multiple first contact areas 154. The first contact areas may also be called pads, source pads and/or studs. The first contact areas 154 are raised above a planar surface 193 of the first portion. The third metallic layer also includes a second portion 194 having multiple second contact areas 156. The second contact areas may also be called pads, gate pads, and/or studs. The second contact areas 156 are raised above a planar surface 195 of the second portion. The first portion and second portion are electrically isolated from one another at least partly through a separation 200, which may be formed in the third layer using any material removal technique. During assembly of the DSC package the first contact areas are electromechanically coupled with the source contacts of the die using electromechanical coupler 162, the second contact areas are electromechanically coupled with the gate contacts 141 using electromechanical coupler 163, and an encapsulant 176 is used to at least partially encapsulate the MIM substrates 180 and 188 and the leads 168, 170, 172, 174 (and to fully encapsulate other elements, such as the die).

When the package is fully assembled the second and fourth metallic layers are at least partially exposed through the encapsulant for dual-side cooling, and each of the leads is also at least partially exposed through the encapsulant to electrically couple the gate, source, and drain contacts of the die with electrical nodes outside the package (including a sensor node coupled with the sensor lead 174). The various elements of the package form different electrical nodes within the package, including: a source node including the source lead, first portion, and source contacts of the semiconductor die; a gate node including the gate lead, second portion, and gate contacts of the semiconductor die; and a drain node including the drain lead, the second metallic layer, and the drain contacts of the semiconductor die. Each node also includes electromechanical couplers. A sensor node may be the same node as the source node and may include the first portion and the sensor lead.

The side partial-see-through view of the top left of FIG. 9 shows a first contact area 154 of the first portion 192 electromechanically coupled with a source contact of one of the semiconductor die 140 and also shows a second contact area 156 of the second portion 194 electromechanically coupled with a gate contact 141 of one of the semiconductor die. Each of the leads may be coupled with its respective metallic layer using an electromechanical coupler.

Electromechanical coupling any elements together may include applying a conductive tape and a heating step, applying a solder or solder paste and applying a heating or reflowing step, applying a metallic powder or paste and sintering, and so forth. The die of FIGS. 7-9 (as with other figures) is seen to be directly coupled with both the second metallic layer and third metallic layer using an electromechanical coupler, but other thin layers such as one or more solder top metal (STM) layers and/or one or more under bump metal (UBM) layers could be included in some implementations. Accordingly, the die may be directly coupled with the second and/or third metallic layers using one or more of: one or more UBM layers, one or more solders (which may include a solder paste), one or more conductive tapes, one or more STM layers, and/or one or more sintered layers. It is seen in the figures that, in the implementations shown, there is no spacer between the die and the second metallic layer, nor is there a spacer between the die and the third metallic layer. This allows for a more compact configuration of the semiconductor package. If a spacer were included between the die and either the second metallic layer or the third metallic layer, the die would not be directly coupled with the second or third metallic layer using one or more solder layers, conductive tapes, UBM layers, STM layers, sintered layers, or the like, but would be indirectly coupled with the second or third metallic layer.

Nevertheless, some implementations could include metallic spacers between the die and the second metallic layer or third metallic layer. In such implementations there could be solder, Ag sintering, or some other electromechanical coupler coupling the die with the spacer, and there could also be a solder, Ag sintering, or some other electromechanical coupler coupling the spacer with the corresponding MIM substrate (second metallic layer or third metallic layer). In some implementations a spacer could be a multilayer or composite spacer. Non-limiting examples include spacers which are formed of multiple metal layers, such as a metal/solder/metal/solder/metal spacer, or a metal/(Ag sintering)/metal spacer, and so forth. The metallic layers of the spacer and the electromechanical couplers between the spacers could be selected for desired mechanical performance, thermal performance, or some other criteria. When the spacers are excluded however, as with the examples illustrated in the drawings, the semiconductor packages may be thinner, simpler and more reliable. In various implementations, the versions without spacers may, for example, have better thermal properties (in other words better dissipation of heat from the die).

It is also seen in the figures that, in implementations, DSC semiconductor packages disclosed herein include no wirebonds and no clips for electrical coupling, but rather the chips/die are directly coupled with the MIM substrates and the MIM substrates are then directly coupled with the leads (through one or more solders, one or more conductive tapes, one or more sintered layers, one or more UBM layers, one or more STM layers, and so forth).

In implementations the source contacts of the semiconductor die may be called first electrical contacts, the gate contacts of the semiconductor die may be called second electrical contacts, and the drain contacts of the semiconductor die may be called third electrical contacts.

In implementations any of the MIM substrates may be direct bonded copper (DBC) substrates using copper layers coupled with $Al_2O_3$ insulator layers, though materials other than copper could be used for the metallic layers and insulator materials other than $Al_2O_3$ could be used for the insulator layers. The metallic layers could in implementations be aluminum, copper, or stainless steel, as examples. The insulator layers could in various implementations be (or include), by non-limiting example, $Al_2O_3$, Zr-doped $Al_2O_3$, AlN, BeO, $Si_3N_4$, an epoxy-based layer, and/or other ceramic, composite, or organic insulator materials. One or more of the MIM substrates could be an insulated metal substrate (IMS) including an aluminum layer, an insulator layer, and a copper layer.

The DSC packages in implementations could be used for any electrical function. In implementations, for example, the DSC packages disclosed herein could be intelligent power modules (IPMs) used for electrical vehicle and/or hybrid electrical vehicle (EV/HEV) inverters. Using dual-side cooling in such an implementation may allow for increases in power density, high operation temperatures, and increased frequencies. Dual-side cooling may also improve thermal performance, electrical performance, and mechanical performance of the semiconductor packages.

As non-limiting examples, in implementations DSC package 100 could have the following features. The MIM substrates could be direct bonded copper (DBC) substrates with $Si_3N_4$ as the insulator layer. The copper layers could each be 0.8 mm thick and the insulator layer could be 0.32 mm thick. The drain DBC substrate could have dimensions of 17 mm by 20.5 mm by 1.47 mm. The source DBC substrate could have dimensions of 17 mm by 20.3 mm by 1.53 mm. Each semiconductor die (or the semiconductor die combined) could have dimensions of 5.08 mm by 4.38 mm by 0.2 mm. The DSC package could have dimensions of 18.8 mm by 28 mm by 3.3 mm. These are only examples, and the packages/layers may have other features and/or be formed of other materials.

As non-limiting examples, in implementations DSC package 102 could have the following features. The MIM substrates could be direct bonded copper (DBC) substrates with $Si_3N_4$ as the insulator layer. The copper layers could each be 0.8 mm thick and the insulator layer could be 0.32 mm thick. The drain DBC substrate could have dimensions of 17 mm by 9.3 mm by 1.47 mm. The source DBC substrate could have dimensions of 17 mm by 9.4 mm by 1.53 mm. Each semiconductor die (or the semiconductor die combined) could have dimensions of 5.08 mm by 4.38 mm by 0.2 mm. The DSC package could have dimensions of 18.8 mm by 17.075 mm by 3.3 mm. DSC package 102 (and its corresponding components) may accordingly be have similar dimensions as DSC package 102 (and its corresponding components) except shorter in one dimension. These are only examples, and the packages/layers may have other features and/or be formed of other materials.

The bottom of FIG. 9 shows a close-up view of layers that are present in both DSC package 138 and DSC package 178. As non-limiting examples, in implementations the layers could have the following features. Both MIM substrates 142/180 and 150/188 could be DBC substrates. The first metallic layer (bottommost layer) 148/186 could be a 0.35 mm thick copper layer. The first insulator layer 146/184 could be a 0.32 mm $Si_3N_4$ ceramic layer. The second metallic layer 144/182 could be a 0.8 mm thick copper layer. The electromechanical coupler 164 electromechanically coupling the semiconductor die 140 with the second metallic layer 144/182 could be a 0.05 mm Ag sintered layer. The semiconductor die could have a thickness of 0.2 mm. The electromechanical couplers 162 electromechanically coupling the first contact areas 154 with the source contacts of the semiconductor die, and the electromechanical couplers 163 electromechanically coupling the second contact areas 156 with the gate contacts of the semiconductor die, could be 0.05 mm layers of SAC305 lead free solder. The first contact areas 154 and second contact areas 156 could have thicknesses of 0.18 mm (in other words, they could each be raised 0.18 mm from the planar surfaces 157/193 and planar surfaces 165/195, respectively). The third metallic layers 152/190 could have thicknesses from uppermost surfaces to planar surfaces 157/193/165/195 of 0.62 mm. The third metallic layers 152/190 could have total thicknesses from uppermost surfaces to a bottom of each first contact area 154 and second contact area 156 of 0.8 mm. The second insulator layer 158/196 may be a 0.32 mm $Si_3N_4$ ceramic layer. The fourth metallic layer 160/198 may be a 0.41 mm copper layer. The DSC packages 138/178 could in implementations have the same overall dimensions as those described above for DSC packages 100/102, respectively. The semiconductor die could be SiC die and/or metal-oxide-semiconductor field-effect transistors (MOSFETs). Any of the leads may be initially coupled with a lead frame (in a row/column or array of devices) and each device may be singulated after encapsulation by severing the package from the lead frame such as by punching or any other singulation technique. These are only examples, and the packages/layers/elements may have other features and/or be formed of other materials. Die other than MOSFETs could be used, such as an insulated gate bipolar transistor (IGBT) or other type of die.

The close-up bottom image of FIG. 9 also shows that the first contact areas are 5-10% narrower (horizontally) than the top surfaces of the die. In implementations this results in better mechanical performance than having the first contact areas the same width or wider than the top surfaces of the die. For example, in mechanical tests comparing an IPM DSC package 138, an IPM DSC package 178, and a prior art non-DSC IPM package (which only had a single MIM substrate, on the drain side), the results given in TABLE 1 below were observed. The results reflect die tensile stresses that are reduced by 18%-20%, epoxy molding compound (EMC) tensile stresses that are reduced by 14%-15%, and die top solder joint reliability that is increased by 49%-53% (resulting in longer fatigue life or, in other words, decreasing the likelihood of a fatigue fracture/failure). All tests used SiC semiconductor die.

TABLE 1

| Mechanical Performance | Prior Art non-DSC IPM | IPM DSC 138 | Reduction | IPM DSC 178 | Reduction |
|---|---|---|---|---|---|
| Die First Principal Stress (S1) (MPa) | 96.0 | 79.1 | 18% | 77.0 | 20% |
| EMC S1 Tensile Stress (MPa) | 184.3 | 158.3 | 14% | 156.3 | 15% |
| Die Top Solder Plastic Strain Energy Density (MPa) | 0.2769 | 0.1288 | 53% | 0.1410 | 49% |

A test of an IPM DSC package 138 had a thermal resistance between junction and case (RthJC) of 0.086 degrees Celsius/W (hereafter C/W), and an IPM DSC package 178 had an RthJC of 0.091 C/W, versus an RthJC of 0.144 C/W for a prior art non-DSC IPM package (which only had a single MIM substrate, on the drain side), reflecting improvements of about 40% and 37%, respectively. A test of an IPM DSC package 138 had a thermal resistance between junction and solder point (RthJS) of 0.181 C/W, and an IPM DSC package 178 had an RthJS of 0.222 C/W, versus an RthJS of 0.266 C/W for a prior art non-DSC IPM package (which only had a single MIM substrate, on the drain side), reflecting improvements of about 32% and 17%, respectively. All tests used SiC semiconductor die.

Tests of IPM DSC packages 138 and 178 also had better electrical performance in terms of drain-source on resistance (R DS(on)) and inductance, due to a larger contact areas and shorter paths, relative to the prior art non-DSC IPM package (which only had a single MIM substrate, on the drain side). All tests used SiC semiconductor die.

Implementations of methods of forming the DSC packages disclosed herein may include the following steps. A top source MIM substrate may be formed. One or more etching steps may be used to form the routing patterns, separating the third metallic layer into first portions and second portions, and to form the first and second contact areas, including raising the first and second contact areas relative to planar surfaces of the first and second portions, respectively. The die may be attached face up on the bottom MIM substrate. A drain lead of a leadframe (LF) may be electromechanically coupled with the second metallic layer of the bottom MIM substrate using a higher melting temperature solder or Ag sintering material (which may include a 260 degrees Celsius first solder reflow or sintering step). For designs which include a gate wirebond, the gate wirebonding process may be included. The top source MIM substrate is then electromechanically coupled with the die sources (and die gates in versions which exclude wirebonds) and with gate, source, and sensor leads of the leadframe using a lower melting temperature solder or Ag sintering material (which may include a 235 degrees Celsius second solder reflow or sintering step). Molding/encapsulation may then be done in such a way that the first metallic layer and fourth metallic layer are at least partially exposed through the encapsulant for dual side cooling, and such that all of the leads are at least partially exposed through the encapsulant. As can be seen from the drawings, in implementations a largest planar surface of each of the first metallic layer and fourth metallic layer is entirely exposed through the encapsulant. The DSC package may then be singulated from the leadframe through a punching or cutting or other singulation technique.

The sensor leads disclosed herein may be used for sensing temperature and/or current at the source node or source contact.

In implementations, having raised first contact areas and second contact areas may, in addition to having other benefits described herein, reduce the likelihood of the top MIM substrate contacting the bottom DBC substrate and causing a short circuit (which may be more likely if the semiconductor die are thin).

In places where the description above refers to particular implementations of dual-side cooling semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other dual-side cooling semiconductor packages and related methods.

What is claimed is:

1. A dual-side cooling (DSC) semiconductor package, comprising:
   a first metal-insulator-metal (MIM) substrate;
   a second MIM substrate comprising a first portion comprising one or more first contact areas and a second portion electrically isolated from the first portion and comprising one or more second contact areas;
   a semiconductor die coupled between the first MIM substrate and the second MIM substrate such that the one or more first contact areas are electrically coupled with one or more first electrical contacts of the semiconductor die and the one or more second contact areas are electrically coupled with one or more second electrical contacts of the semiconductor die, wherein the semiconductor die is directly coupled with the second MIM substrate; and
   an encapsulant at least partially encapsulating the first MIM substrate and the second MIM substrate, wherein the first MIM substrate and the second MIM substrate are each at least partially exposed through the encapsulant.

2. The semiconductor package of claim 1, wherein the first MIM substrate comprises a first direct bonded copper (DBC) substrate and the second MIM substrate comprises a second DBC substrate.

3. The semiconductor package of claim 1, wherein all electrical paths from outside the semiconductor package to the semiconductor die include second MIM substrate.

4. The semiconductor package of claim 1, wherein the one or more first electrical contacts comprise one or more source contacts, wherein the one or more second electrical contacts comprise one or more gate contacts, wherein the semiconductor die comprises one or more drain contacts, and wherein the semiconductor package further comprises a gate lead electrically coupled with the second MIM substrate.

5. The semiconductor package of claim 1, further comprising a first lead coupled to the first MIM substrate and a second lead coupled to the second MIM substrate.

6. The semiconductor package of claim 1, wherein the one or more first contact areas comprise a largest planar surface that is smaller than a largest planar surface of the semiconductor die.

7. The semiconductor package of claim 1, wherein the one or more first contact areas are formed from a metallic layer comprised in the second MIM substrate and are raised above a planar surface of the first portion; and wherein the one or more second contact areas are formed from the metallic layer and are raised above a planar surface of the second portion.

8. The semiconductor package of claim 1, wherein the semiconductor die is directly coupled with the first MIM substrate through one of one or more solders, one or more sintered layers, one or more electrically conductive tapes, one or more solderable top metal (STM) layers, or one or more under bump metal (UBM) layers.

9. A dual-side cooling (DSC) semiconductor package, comprising:
   a first metal-insulator-metal (MIM) substrate;
   a second MIM substrate comprising one or more contact areas;
   a semiconductor die coupled between the first MIM substrate and the second MIM substrate such that the one or more contact areas are electrically coupled with one or more first electrical contacts of the semiconductor die, wherein the semiconductor die is directly coupled with the second MIM substrate;
   a first lead electrically coupled with the first MIM substrate;
   a second lead electrically coupled with the second MIM substrate;
   a third lead electrically coupled with one or more second electrical contacts of the semiconductor die through one or more wirebonds; and
   an encapsulant at least partially encapsulating the first MIM substrate and the second MIM substrate.

10. The semiconductor package of claim 9, wherein the one or more first electrical contacts comprise one or more source contacts, wherein the one or more second electrical contacts comprise one or more gate contacts, wherein the semiconductor die comprises one or more third electrical contacts comprising one or more drain contacts, wherein the first lead comprises a drain lead and is electrically coupled with the one or more drain contacts, wherein the second lead comprises a source lead and is electrically coupled with the one or more source contacts, and wherein the third lead comprises a gate lead and is electrically coupled with the one or more gate contacts.

11. The semiconductor package of claim 9, wherein the one or more contact areas comprise a largest planar surface that is smaller than a largest planar surface of the semiconductor die.

12. The semiconductor package of claim 9, wherein the one or more contact areas are raised above a planar surface of the second MIM substrate.

13. The semiconductor package of claim 9, wherein the semiconductor die is directly coupled with the first MIM through one of one or more solders, one or more sintered layers, one or more electrically conductive tapes, one or more solderable top metal (STM) layers, or one or more under bump metal (UBM) layers.

14. A dual-side cooling (DSC) semiconductor package, comprising:
   a first substrate;
   a second substrate comprising a first portion comprising one or more first contact areas raised above a planar surface of the first portion and a second portion electrically isolated from the first portion and comprising one or more second contact areas raised above a planar surface of the second portion;
   a semiconductor die coupled between the first substrate and the second substrate such that the one or more first contact areas are electrically coupled with one or more first electrical contacts of the semiconductor die and the one or more second contact areas are electrically coupled with one or more second electrical contacts of the semiconductor die; and
   an encapsulant at least partially encapsulating the first substrate and the second substrate.

15. The semiconductor package of claim 14, wherein the semiconductor die is directly coupled with the first substrate through one of one or more solders, one or more sintered layers, one or more electrically conductive tapes, one or more solderable top metal (STM) layers, or one or more under bump metal (UBM) layers; and wherein the semiconductor die is directly coupled with the second substrate through one of one or more solders, one or more sintered layers, one or more electrically conductive tapes, one or more solderable top metal (STM) layers, or one or more under bump metal (UBM) layers.

16. The semiconductor package of claim 14, wherein all electrical paths from outside the semiconductor package to the semiconductor die are routed through one of the first substrate or the second substrate.

17. The semiconductor package of claim 14, further comprising a first lead coupled to the first substrate and a second lead coupled to the second substrate.

18. The semiconductor package of claim 14, wherein the one or more first contact areas comprise a largest planar surface that is smaller than a largest planar surface of the semiconductor die.

\* \* \* \* \*